(12) United States Patent
Guy

(10) Patent No.: US 6,580,025 B2
(45) Date of Patent: Jun. 17, 2003

(54) APPARATUS AND METHODS FOR THERMOELECTRIC HEATING AND COOLING

(75) Inventor: James K Guy, Mesa, AZ (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 09/921,954

(22) Filed: Aug. 3, 2001

(65) Prior Publication Data
US 2003/0024565 A1 Feb. 6, 2003

(51) Int. Cl.[7] .................. H01L 35/34; H01L 35/28; F25B 21/02
(52) U.S. Cl. ............... 136/201; 136/203; 62/3.3
(58) Field of Search ................. 136/200, 201, 136/203, 204; 62/3.3, 3.6, 3.61

(56) References Cited

U.S. PATENT DOCUMENTS

| | | | |
|---|---|---|---|
| 664,776 A | * 12/1900 | Porter | 126/110 B |
| 2,959,018 A | * 11/1960 | Hwang | 392/362 |
| 3,019,609 A | * 2/1962 | Pietsch | 62/3.3 |
| 4,326,383 A | 4/1982 | Reed et al. | 62/3 |
| 4,512,758 A | 4/1985 | Wedemeyer et al. | 494/13 |
| 4,782,664 A | 11/1988 | Stema et al. | 62/3 |
| 4,855,810 A | 8/1989 | Gelb et al. | 357/87 |
| 5,269,146 A | 12/1993 | Kerner | 62/3.6 |
| 5,301,508 A | 4/1994 | Kahl | 62/3.62 |
| 5,441,576 A | 8/1995 | Bierschenk et al. | 136/203 |
| 5,456,081 A | 10/1995 | Chrysler et al. | 62/3.7 |
| 5,547,019 A | 8/1996 | Iacullo | 165/51 |
| 5,623,828 A | 4/1997 | Harrington | 62/3.2 |
| 6,034,317 A | 3/2000 | Watanabe et al. | 136/203 |
| 6,034,318 A | 3/2000 | Lycke et al. | 136/205 |
| 6,043,423 A | 3/2000 | Satomura et al. | 136/211 |
| 6,065,293 A | 5/2000 | Ghoshal | 62/3.2 |
| 6,067,802 A | 5/2000 | Alonso | 62/3.7 |
| 6,100,463 A | 8/2000 | Ladd et al. | 136/201 |
| 6,223,539 B1 | * 5/2001 | Bell | 62/3.3 |

* cited by examiner

Primary Examiner—Patrick Ryan
Assistant Examiner—Thomas H. Parsons
(74) Attorney, Agent, or Firm—Harness Dickey Pierce P.L.C.

(57) ABSTRACT

A thermoelectric device adaptable for heating and for cooling a fluid such as air. The device includes at least one thermoelectric module and at least one rotating heat sink that transfer heat between the thermoelectric module(s) and the fluid. The heat sink(s) are mounted on a shaft and include a plurality of thermally conductive impeller blades. The thermoelectric module(s) rotate with the heat sink(s) about the shaft. Because the thermoelectric module(s) are in direct contact with the thermally conductive impeller, heat is transferred more efficiently into and out of the thermoelectric device. Because the impeller blades also act as heat sinks, fewer components are needed than with conventional devices.

24 Claims, 2 Drawing Sheets

APPARATUS AND METHODS FOR THERMOELECTRIC HEATING AND COOLING

FIELD OF THE INVENTION

The present invention relates generally to thermoelectric heating and cooling devices and systems and, more particularly, to a thermoelectric heating and cooling device having at least one rotating heat sink.

BACKGROUND OF THE INVENTION

Thermoelectric (TE) modules are increasingly incorporated into heating and cooling devices and systems. Solid-state TE modules are currently available in a range of sizes and typically are used in heating and cooling applications where device size, weight and reliability are important concerns. It is common to assemble a TE heating or cooling device by placing the TE module between two surfaces to be temperature-controlled. A cold surface of the TE module typically is used to extract the heat out of a hot component. The heat is transferred to a hot side of the TE module, where a heat sink or heat exchanger is employed to remove the heat to the surrounding environment. Fans, blowers or pumps typically move a cooling fluid (e.g. air or water) across the heat sinks or heat exchangers to remove the heat. Thus, although TE modules are available in small sizes, the additional components needed to support their operation in a TE heating or cooling device can add undesirable size and weight to the device.

SUMMARY OF THE INVENTION

In one preferred form, the present invention provides a thermoelectric device adaptable for heating and for cooling a fluid such as air. The device includes at least one thermoelectric module and at least one rotating heat sink configured to transfer heat between the thermoelectric module(s) and the fluid. The heat sink(s) are mounted on a shaft and include a plurality of thermally conductive impeller blades. The thermoelectric module(s) rotate with the heat sink(s) about the shaft.

Because the thermoelectric module(s) are in direct contact with the rotating heat sink, heat is transferred more efficiently into and out of the thermoelectric device. Because the impeller blades not only move air through the device but also act as heat sinks, fewer components are needed than with conventional devices. Size and weight of the device also are significantly less than those of conventional devices.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
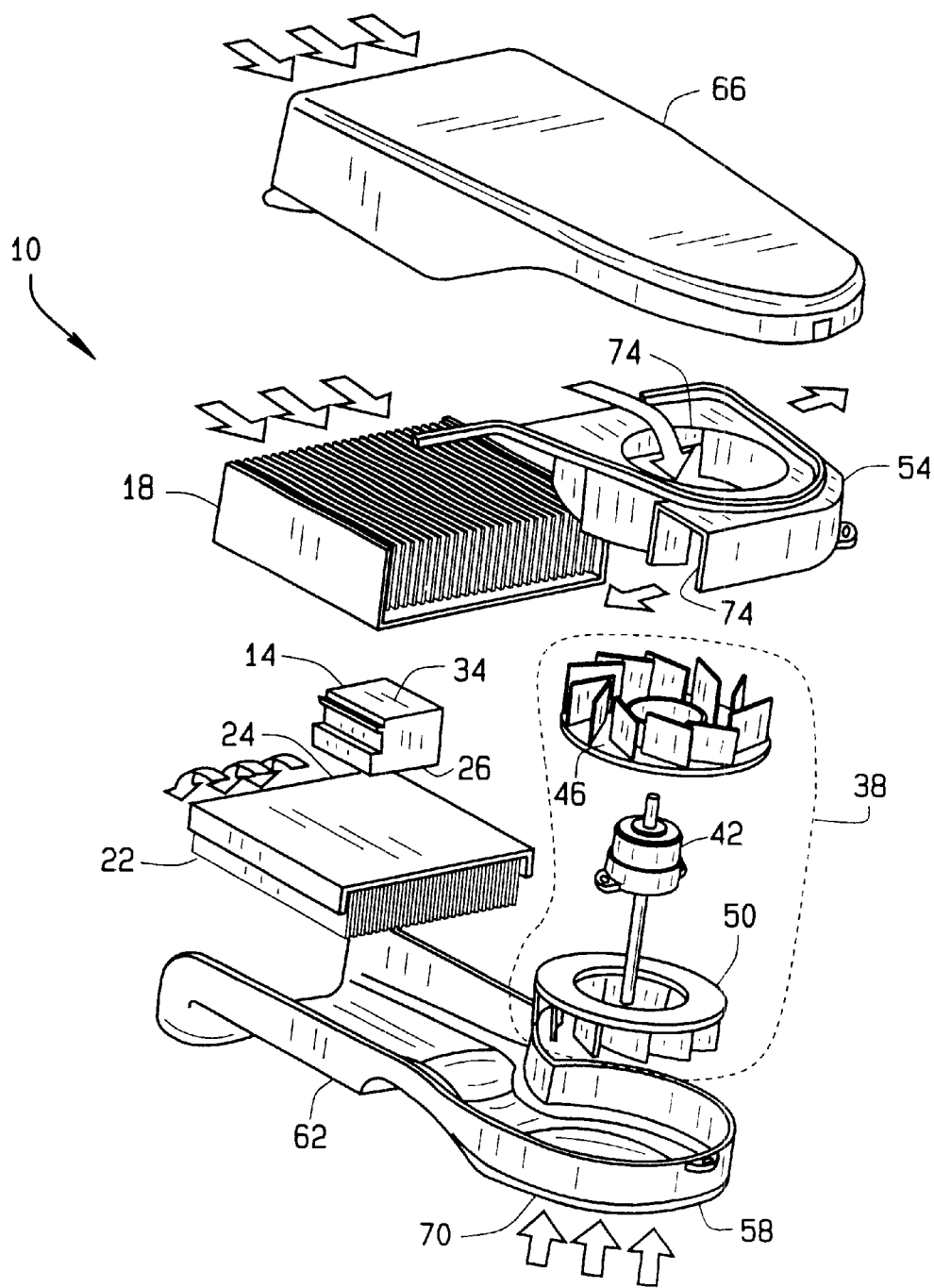
FIG. 1 is an exploded perspective view of a thermoelectric cooling device of the prior art.

The following description of the preferred embodiments is merely exemplary in nature and is in no way intended to limit the invention, its application, or uses. FIG. 1 is an exploded perspective view of a conventional thermoelectric cooling device, generally indicated by the reference number 10. A TE module 14 is positioned between an outside heat sink 18 and an inside heat sink 22. The TE module 14 has a "cold" surface 26 thermally connected to the inside heat sink 22, and a "hot" surface 34 thermally connected to the outside heat sink 18. A fan apparatus 38 driven by a motor 42 includes an outside fan 46 fixedly attached to an inside fan 50. The outside and inside fans 46 and 50 are positioned respectively adjacent the outside and inside heat sinks 18 and 22. The outside fan 46 is enclosed in a fan shroud 54 and the inside fan 50 is enclosed in an extension 58 of an inside heat sink cover 62. The fan shroud 54 is seated upon the extension 58 of the inside heat sink cover 62. An outside cover 66 is seated upon the fan shroud 54 and, together with the inside heat sink cover 62, partially encloses the heat sinks 18 and 22.

In operation, the TE device 10 performs cooling in the following manner. Air surrounding the TE device 10 is pulled into the inside fan 50 through an air intake opening 70 in the heat sink cover extension 58. The inside fan 50 circulates the air into the inside heat sink 22, which collects heat from the air as the air passes through the heat sink 22 and through an outlet 24 into an air distribution duct (not shown). The "cold" surface 26 of the TE module 14 picks up the heat, which is transferred, via the TE "hot" surface 34, to the outside heat sink 18. The outside fan 46 pulls air through the outside heat sink 18 and circulates the heated air into an air exhaust (not shown) via openings 74 in the fan shroud 54.

As can be seen in FIG. 1, proper operation of the TE device 10 is dependent upon the circulation of air through the heat sinks 18 and 22 by the fans 46 and 50. The fan apparatus 38 and heat sinks 18 and 22 occupy an appreciable amount of space. Thus, installing such a device can be impracticable in environments in which adequate space is not available.

Figure 2:
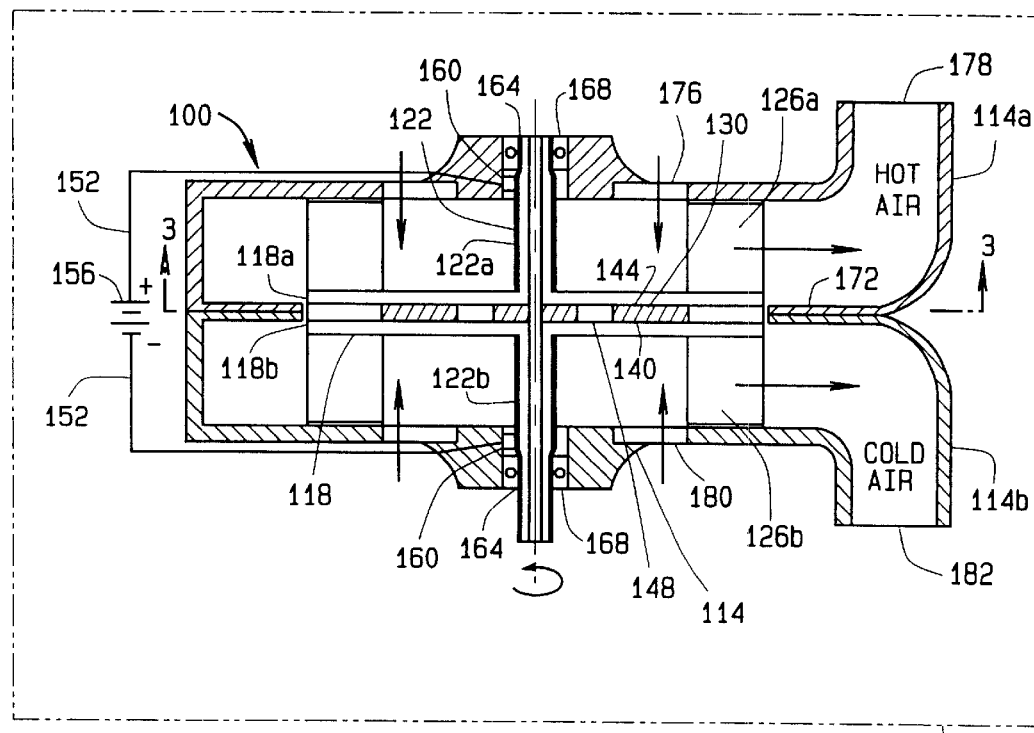
FIG. 2 is a cross-sectional view of a preferred embodiment of a thermoelectric heating and cooling device according to the present invention.

FIG. 2 is a sectional view of a preferred embodiment of a thermoelectric heating and cooling device, referred to generally by the reference number 100, in accordance with the present invention. The device 100 is used, for example, in an avionic system 112 to cool air within an engine compartment. The device 100 can be adapted, however, for use in other applications besides avionics systems and can be used in other types of spaces besides engine compartments. A housing 114 houses a thermally conductive impeller 118 fixedly mounted on a drive shaft 122. The shaft 122 is driven by a motor or drive system (not shown). The shaft 122 includes two electrically conducting sections 122a and 122b. The sections 122a and 122b can be supported and aligned by a central electrically non-conducting rod (not shown) fabricated, for example, of a ceramic material. Fixedly mounted on the impeller 118 adjacent the impeller outer edge are a plurality of curved thermally conductive blades 126. More specifically, the impeller 118 includes two opposed sections 118a and 118b, upon which are disposed respectively two sets of blades 126a and 126b. The shaft sections 122a and 122b are attached respectively to the impeller sections 118a and 118b. The impeller 118 and blades 126 are fabricated of a thermally conductive material such as copper, aluminum, or spheroid carbon.

At least one TE module 130 is fixedly mounted between the impeller sections 118a and 118b. Each TE module 130 has a "cold" side 140 thermally connected to the impeller section 118b and a "hot" side 144 thermally connected to the impeller section 118a. An insulative fill material 148, for example, silicone potting material, fills voids between the impeller sections 118a and 118b. A pair of leads 152 electrically connects a power source 156 to the shaft sections 122a and 122b via a pair of spring-loaded carbon motor brushes 160. Electrical leads (not shown) from each TE module 130 also are electrically connected to the shaft sections 122a and 122b. The shaft 122 is rotatably mounted through opposed openings 164 in the housing 114 via bearings 168. The TE modules are fabricated, for example, by Tellurex Corporation of Traverse City, Mich.

The impeller 118 is aligned with an inner shelf 172 of the housing 114 so as to partition the housing 114 into two chambers, a "hot" air chamber 114a and a "cold" air chamber 114b. An air inlet 176 is configured to allow air into the chamber 114a, and an air outlet 178 allows air to exit the chamber 114a. Similarly, an air inlet 180 allows air to enter the chamber 114b, and an air outlet 182 allows air to leave the chamber 114b.

Figure 3:
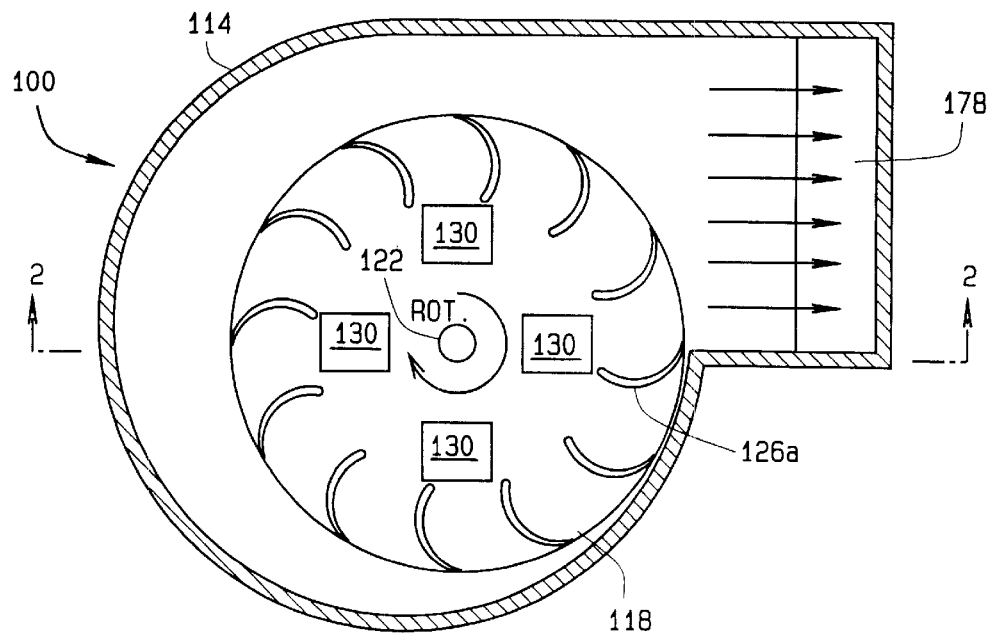
FIG. 3 is a cross-sectional view of the thermoelectric heating and cooling device taken along the plane of line 3—3 in FIG. 2.

FIG. 3 is a sectional view of the device 100. Referring to FIGS. 2 and 3, when the TE device 100 is in operation, the impeller 118 rotates within the housing 114. The blades 126 pull ambient air into the chambers 114a and 114b. Air entering the "cold" air chamber 114b comes into thermal contact with the blades 126b and impeller section 118b, which transfer heat from the air to the "cold" surface 140 of each TE module 130. The rotating shaft sections 122a and 122b provide electrical power from the power source 156 to each TE module 130. The rotating blades 126b push the cooled air out of the "cold" air chamber 114b through the outlet 182. Each TE module 130 transfers heat from its "cold" surface 140 to its "hot" surface 144, from which the heat is transferred to the impeller section 118a and the blades 126a. As the impeller rotates in the "hot" air chamber 114a, heat is convected from the impeller section 118a and the blades 126a into the air. The heated air is blown out of the chamber 114a through the outlet 178.

The device 100 thus embodies a method for changing the temperature of a fluid within a space such as an engine compartment, the method including the steps of drawing the fluid from the space into a housing using an impeller rotating within the housing such that the impeller is immersed in the moving fluid; using at least one thermoelectric module to transfer heat through the impeller from the fluid on a cold side of the impeller to the fluid on a hot side of the impeller; and pushing warmed and cooled fluid out of the housing using the impeller.

The TE modules 130 are in direct contact with the rotating impeller 118 and blades 126, thus increasing the efficiency of heat transfer into and out of the device 100. Because the impeller 118 and the blades 126 not only move air through the device 100 but also act as heat sinks, fewer components are needed than with conventional devices. Size and weight of the device 100 also are significantly less than those of conventional devices. The device 100 can be utilized as a compact cooling device and alternatively can be configured to provide heating.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A thermoelectric device adaptable for heating and for cooling a fluid, the device comprising at least one thermoelectric module and at least one rotating heat sink configured to transfer heat between the at least one thermoelectric module and the fluid; wherein the at least one heat sink further comprises an impeller and a plurality of curved blades adjacent an outer circumferential edge of the impeller.

2. The device of claim 1 further comprising a shaft on which the at least one heat sink is mounted, the at least one thermoelectric module configured to rotate with the at least one heat sink about the shaft.

3. The device of claim 2 wherein the shaft comprises a plurality of electrically conductive sections and the at least one thermoelectric module is electrically powered via the shaft sections.

4. The device of claim 1 wherein the impeller blades are thermally conductive.

5. The device of claim 4 wherein the impeller blades comprise at least one of copper, aluminum and spheroid carbon.

6. The device of claim 1 wherein the at least one heat sink is configured to circulate the fluid through the device.

7. The device of claim 1, further comprising a shaft having a plurality of electrically conductive sections between which the at least one thermoelectric module is electrically connected and the heat sink is configured to rotate.

8. A thermoelectric device adaptable for heating and for cooling a fluid, the device comprising at least one thermoelectric module and a thermally conductive impeller that circulates the fluid through the device, the impeller configured to transfer heat to and from the fluid through the at least one thermoelectric module; the device further comprising a shaft having a plurality of electrically conductive sections between which the impeller is mounted.

9. The device of claim 8 wherein the impeller comprises at least one heat sink thermally connected to the at least one thermoelectric module and configured to transfer heat between the fluid and the at least one thermoelectric module.

10. The device of claim 8 wherein the at least one thermoelectric module is electrically powered via the shaft.

11. The device of claim 10 wherein the at least one thermoelectric module rotates with the impeller about the shaft.

12. The device of claim 8 wherein the impeller comprises at least one of copper, aluminum and spheroid carbon.

13. An avionic system comprising a thermoelectric device for changing the temperature of a fluid, the device comprising at least one thermoelectric module configured to transfer heat between the at least one thermoelectric module and at least one heat sink through which the fluid is circulated, the device further comprising a shaft having a plurality of electrically conductive sections, and an impeller that rotates about the shaft to circulate the fluid through the device, the at least one thermoelectric module mounted to the impeller and configured to rotate therewith between the sections.

14. The avionic system of claim 13 wherein the impeller comprises two thermally conductive sections between which the at least one thermoelectric module is mounted.

15. The avionic system of claim 13 wherein the impeller comprises a plurality of thermally conductive blades.

16. The avionic system of claim 13 wherein the impeller comprises the at least one heat sink.

17. The avionic system of claim 13 wherein the shaft is configured to provide electrical power to the at least one thermoelectric module.

18. A method for changing the temperature of a fluid within a space, the method comprising the steps of:

drawing the fluid from the space into a housing using an impeller rotating within the housing such that the impeller is immersed in the moving fluid;

transferring heat through the impeller from the fluid on a cold side of the impeller to the fluid on a hot side of the impeller, using at least one thermoelectric module electrically connected to a power source via conductive sections of a shaft between which the impeller rotates; and pushing warmed and cooled fluid out of the housing using the impeller.

19. The method of claim 18 wherein the step of transferring heat through the impeller comprises rotating the at least one thermoelectric module with the impeller through the fluid.

20. The method of claim 18 wherein the step of transferring heat through the impeller comprises using the impeller as a heat sink.

21. A thermoelectric device adaptable for heating and for cooling a fluid, the device comprising:

at least one thermoelectric module;

at least one rotating heat sink configured to transfer heat between the at least one thermoelectric module and the fluid; and a shaft having a plurality of electrically conductive sections between which the at least one thermoelectric module is electrically connected and between which the at least one heat sink is configured to rotate.

22. The device of claim 21, wherein the at least one heat sink comprises a plurality of curved blades adjacent an outer circumferential edge of the heat sink.

23. The device of claim 21, wherein the at least one heat sink comprises at least one of copper, aluminum and spheroid carbon.

24. The device of claim 21, wherein the at least one heat sink is configured to circulate the fluid through the device.

* * * * *